(12) United States Patent
Bencher et al.

(10) Patent No.: US 10,509,328 B2
(45) Date of Patent: Dec. 17, 2019

(54) FABRICATION AND USE OF DOSE MAPS AND FEATURE SIZE MAPS DURING SUBSTRATE PROCESSING

(71) Applicant: Applied Materials, Inc., Santa Clara, CA (US)

(72) Inventors: Christopher Dennis Bencher, Cupertino, CA (US); Joseph R. Johnson, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/964,986

(22) Filed: Apr. 27, 2018

(65) Prior Publication Data

US 2019/0332020 A1  Oct. 31, 2019

(51) Int. Cl.
*G03F 7/20* (2006.01)
*G06T 7/00* (2017.01)

(52) U.S. Cl.
CPC .......... *G03F 7/70558* (2013.01); *G03F 7/705* (2013.01); *G06T 7/0006* (2013.01); *G06T 2207/30121* (2013.01); *G06T 2207/30148* (2013.01)

(58) Field of Classification Search
CPC ... G03F 7/70558; G03F 7/705; G06T 7/0006; G06T 2207/30121; G06T 2207/30148
See application file for complete search history.

(56) References Cited

U.S. PATENT DOCUMENTS

| | | | |
|---|---|---|---|
| 8,103,980 B2* | 1/2012 | Emi | B82Y 10/00 382/141 |
| 2003/0170552 A1 | 9/2003 | Miyashita et al. | |
| 2007/0222961 A1* | 9/2007 | Schmidt | G03F 7/70291 355/69 |
| 2009/0104549 A1 | 4/2009 | Sandstrom et al. | |
| 2009/0170039 A1 | 7/2009 | Chen et al. | |
| 2012/0264063 A1* | 10/2012 | Yu | G03F 7/705 430/313 |
| 2012/0286170 A1* | 11/2012 | Van De Peut | B82Y 10/00 250/397 |
| 2013/0339910 A1 | 12/2013 | Tyminski et al. | |
| 2015/0213172 A1* | 7/2015 | Luoh | G06F 17/5045 716/102 |

(Continued)

OTHER PUBLICATIONS

PCT Notification of Transmittal of the International Search Report and the Written Opinion of the International Searching Authority for International Application No. PCT/US2019/024275; dated Jul. 9, 2019; 12 total pages.

*Primary Examiner* — Deoram Persaud
(74) *Attorney, Agent, or Firm* — Patterson + Sheridan, LLP

(57) ABSTRACT

Systems and methods discussed herein relate to patterning substrates during lithography and microlithography to form features to a set or sets of critical dimensions using dose. The dose maps are generated based upon images captured during manufacturing to account for process variation in a plurality of operations employed to pattern the substrates. The dose maps are used along with imaging programs to tune the voltages applied to various regions of a substrate in order to produce features to a set or sets of critical dimensions and compensate for upstream or downstream operations that may otherwise result in incorrect critical dimension formation.

20 Claims, 9 Drawing Sheets

(56) References Cited

U.S. PATENT DOCUMENTS

| | | |
|---|---|---|
| 2016/0216615 A1* | 7/2016 | Bencher ................. G03F 7/702 |
| 2016/0223903 A1 | 8/2016 | Lee et al. |
| 2019/0011841 A1* | 1/2019 | De Jager ............ G03F 7/70383 |
| 2019/0056673 A1* | 2/2019 | Li ....................... G03F 7/70641 |
| 2019/0147127 A1* | 5/2019 | Su ........................... G03F 7/705 |

* cited by examiner

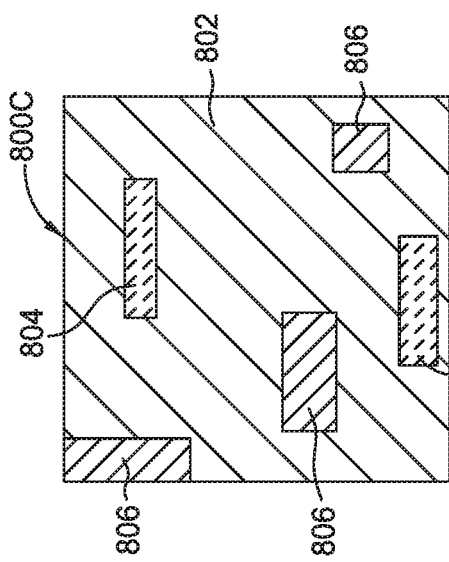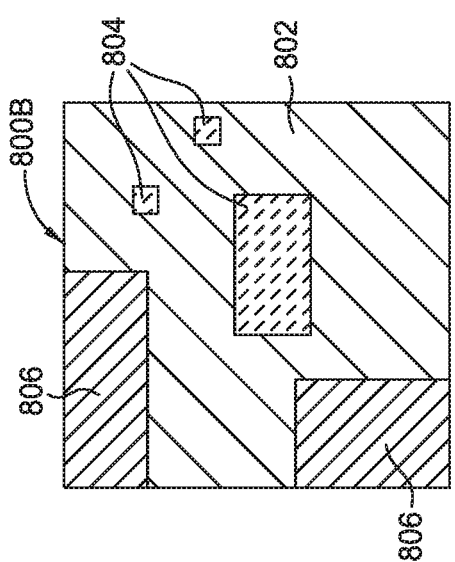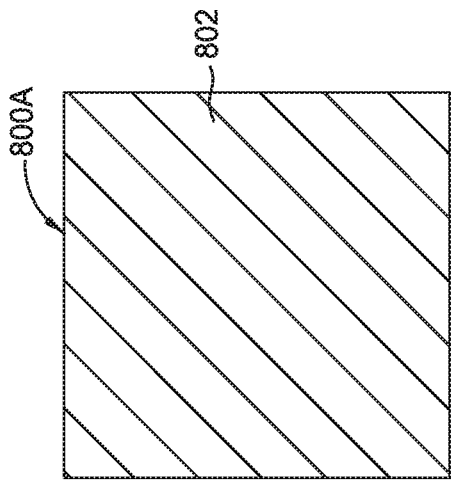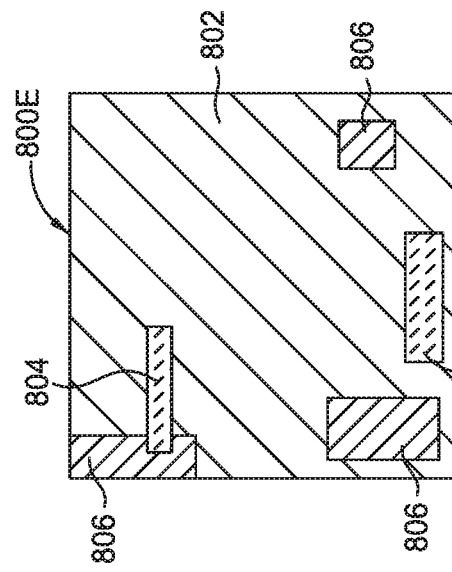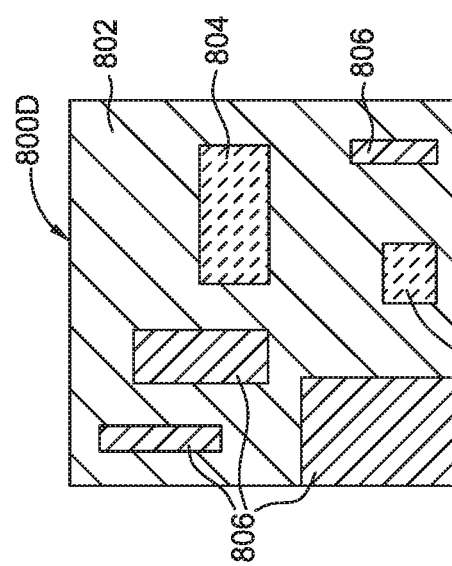

FABRICATION AND USE OF DOSE MAPS AND FEATURE SIZE MAPS DURING SUBSTRATE PROCESSING

BACKGROUND

Field

Embodiments of the present disclosure generally relate to apparatuses, systems and methods for processing one or more substrates, and more specifically to apparatuses, systems and methods for performing photolithography processes.

Description of the Related Art

Photolithography is widely used in the manufacturing of semiconductor devices and display devices such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

SUMMARY

The present disclosure generally relates to substrate processing using dose maps and the generation of the dose maps. In an embodiment, a method of display manufacturing comprising: receiving, by an application stored on a fabrication system, at least one input associated with component fabrication, wherein the input comprises a component identifier or a fabrication line identifier; selecting, by the application, based on the at least one input, from a data store comprising a plurality of fabrication programs, a fabrication program comprising a map that identifies a plurality of regions on a target, wherein each region of the plurality of regions is associated with a different dose type; executing the fabrication program, wherein a plurality of pulses are applied to an electromagnetic radiation device based upon the map to deliver the different dose types; and generating, subsequent to executing the fabrication program, a plurality of features of a predetermined size on the substrate. In an alternate embodiment, a method of device fabrication, comprising: selecting, by an application stored in a non-transitory memory of a fabrication server in response to receiving a plurality of fabrication inputs, a fabrication program associated with at least one of the plurality of fabrication inputs, wherein each fabrication program is associated with a plurality of processing parameters for a fabrication line; selecting, by the application, based on the plurality of fabrication inputs, a dose map of a plurality of dose maps; modifying, by the application, based on the dose map, a subset of processing parameters of the plurality of processing parameters in the selected fabrication program; subsequent to the modification of the subset of processing parameters, executing, by the application, the selected fabrication program; and forming, in response to the execution of the selected fabrication program by the application, a plurality of features of a target size across a substrate.

In an embodiment, a non-transitory computer-readable storage medium including contents that are configured to cause a fabrication system to selectively apply pulses to regions of a light source to apply doses to pattern a substrate by performing a method comprising: selecting, in response to receiving a plurality of fabrication inputs, a fabrication program associated with at least one of the plurality of fabrication inputs, wherein each fabrication program is associated with a plurality of processing parameters for a fabrication line; selecting, based on the plurality of fabrication inputs, a dose map of a plurality of dose maps; modifying, based on the selected dose map, a subset of processing parameters of the plurality of processing parameters in the selected fabrication program; subsequent to the modification of the subset of processing parameters, executing, by the application, the modified fabrication program; and forming, in response to the execution of the modified fabrication program, a plurality of features of a target size across a substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 8A illustrates a dose map where a single dose type is applied from edge to edge according to embodiments of the present disclosure.

FIGS. 8B and 8C are exemplary dose maps according to embodiments of the present disclosure.

FIGS. 8D and 8E illustrate example dose maps for different components manufactured on the same fabrication line according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
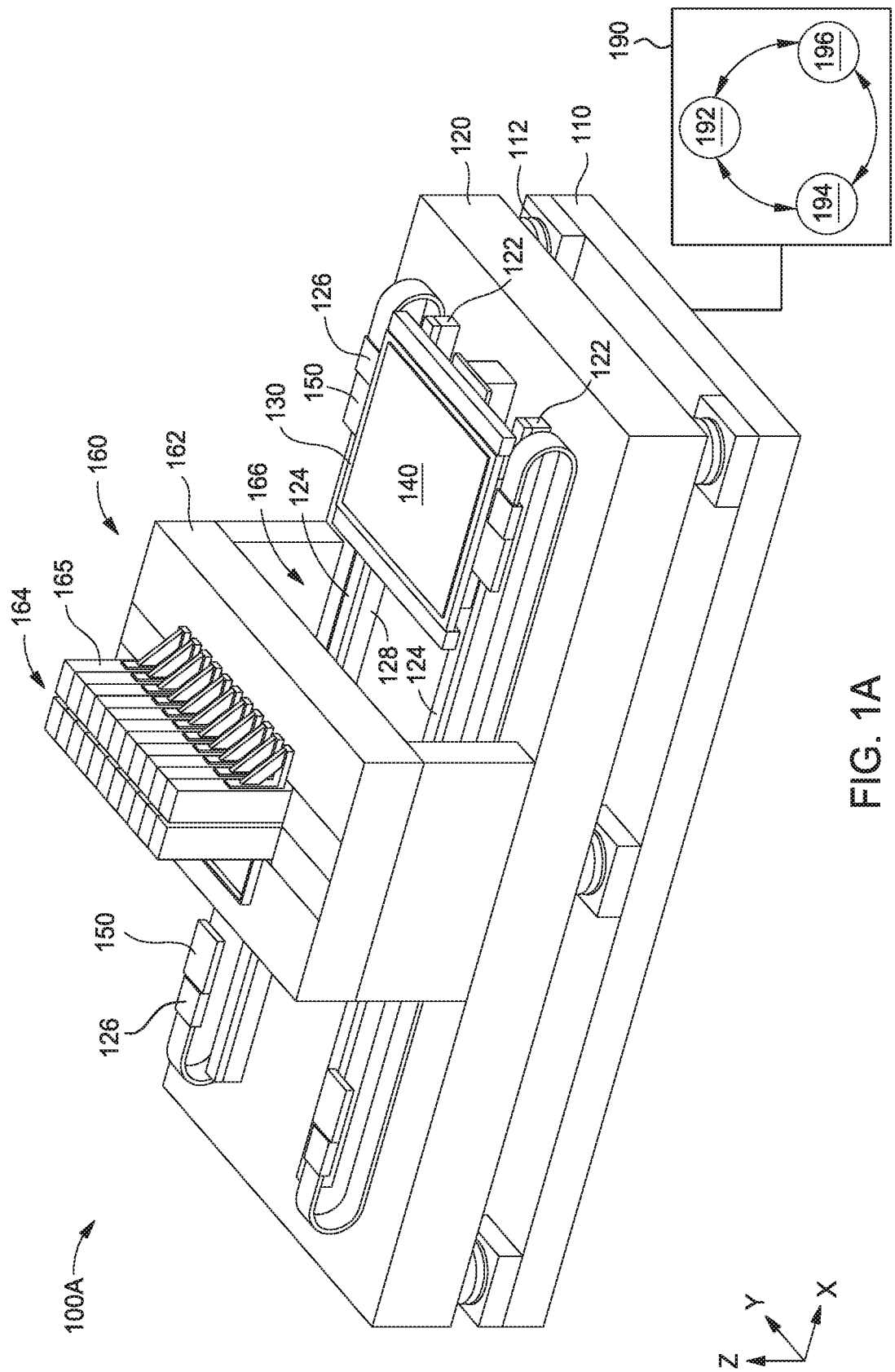
FIG. 1A is a perspective view of a photolithography system according to embodiments disclosed herein.

Embodiments of the present disclosure provide improved photolithography systems and methods using a solid state emitter device for operations including substrate patterning. Solid state emitters emit electromagnetic radiation and are microscopic (for example, less than about 100 µm at the largest dimension). In some examples, light emitting diodes such as microLEDs may be employed. Various examples of solid state emitter devices include an array of solid state emitters arranged in a plurality of horizontal rows and vertical columns. Each solid state emitter may be associated with at least one pixel. In some embodiments, a plurality of sub-pixels may be associated with each pixel. Using the systems and methods discussed herein, an intensity of brightness of individual solid state emitters, regions, columns, and/or rows of solid state emitters are made variable and controllable, thus impacting the dose received by the substrate. In an embodiment, the doses applied to a substrate are controllable for improved field brightness uniformity and field stitching. Regions of solid state emitters, individual solid state emitters, individual rows and/or columns, or groups of rows and/or columns, may be referred to generally herein as "subsets." Controlling the variable intensity of these arrays includes, for example, varying the signal (pulse), such as voltage, that is applied to regions of an array of solid state emitters to a single solid state emitter in various regions in order to form features on the substrate receiving the varying doses of exposure that are consistent in size. This control of intensity may be executed based on a dose map or a feature size map in order to adjust and accommodate for variation in feature sizes created by the fabrication process both before and after the solid state emitter exposure.

"Feature size mapping" as discussed herein is the process that captures images that reflect feature sizes in various locations across a substrate or a batch of substrates as those features are formed through fabrication operations. The feature size maps may be employed in conjunction with and/or to modify existing (previously stored) fabrication programs where a pulse with a single intensity and duration was to be applied over the entire substrate. Feature size mapping produces feature size maps, which are employed by fabrication systems to modify existing stored programs by adjusting process operations including exposures by electromagnetic radiation-generating devices. The feature size maps are used to determine which operations of a fabrication process are modified, and which parameters within those operations are modified, to produce consistently sized features across a substrate or batch of substrates. This can be accomplished by taking into account process variations that may lead to undersized or oversized features, as indicated on a feature size map generated via feature size mapping. In one example, one or more dose types applied to various regions of a substrate may be modified in their intensity and/or duration based upon real-time data and/or a stored history of feature size maps based on images captured during the fabrication process, more specifically, based on the analysis of the captured images that generates the feature size maps. In some examples, feature size maps may be linked to fabrication programs and/or component identifiers without analysis specific to the programs or component identifiers, for example, when feature size maps have successfully produced substrates with consistent feature sizes for related or similar components or fabrication programs.

"Dose mapping" as discussed herein is the process of determining, based on analysis of a plurality of images of substrates during a fabrication process, what doses are to be applied to various portions of a substrate for a particular component, fabrication line, end assembly, or combinations thereof. The dose maps discussed herein may be generated based on the methods discussed herein. The dose maps may be employed in conjunction with and/or to modify existing (previously stored) fabrication programs where a pulse with a single intensity and duration was to be applied over the entire substrate. Dose mapping produces these dose maps, which are employed by fabrication systems to modify existing stored programs to produce consistently sized features across a substrate or batch of substrates by taking into account process variations that may lead to undersized or oversized features. That is, the dose types applied to various regions of a substrate may be modified in their intensity and/or duration based upon real-time data and/or a stored history of images, which can include the feature size maps discussed above, captured during the fabrication process, more specifically, based on the analysis of the captured images. In some examples, dose maps may be linked to fabrication programs and/or component identifiers without analysis specific to the programs or component identifiers, for example, when dose maps have successfully produced substrates with consistent feature sizes for related or similar components or fabrication programs. The difference between the feature size maps and the dose maps discussed herein is that varying doses of electromagnetic radiation may be to a substrate applied based on the feature size maps, but other process parameters may additionally be adjusted, for example, in the etching or photoresist coating operations, or in other operations. Additionally, in some examples, a dose map or maps may be derived from a feature size map, and a fabrication program can be associated with either or both of a feature size map or a dose map.

In one example of display manufacture, a fabrication line comprises a plurality of equipment configured to execute a plurality of sequential and/or simultaneous processes. In an embodiment, a glass panel may be coated with a photoresist, then undergo lithography, then a developer process, and a subsequent etching process. These manufacturing steps may cause feature size variation in dimensions across the panel due to, for example, an inconsistent photoresist thickness, developer materials, processing temperatures, dry etch materials and processing equipment, etching equipment and/or materials, or other factors. Each product fabricated is associated with a target feature size or size range. The features are formed during various fabrication steps, and variation in feature sizes may lead to compromised quality and additional cost. This feature size variation thus negatively impacts the component and potentially its final assembly, as well as the ability of subsequent manufacturing steps to accomplish the intended purposes. For example, if an intended feature size of the display is X-microns, there may be feature sizes both greater than and less than X formed by the manufacturing process. By determining where the under or oversized regions of features are located on a substrate enables modification of fabrication programs in order to adjust the dose types applied to these areas during lithography in order to consistently produce target-sized features across an entire substrate. As discussed herein, a "dose type" refers to an intensity and a duration of a dose applied to a substrate in response to current (pulses) applied to a light-generating source used to pattern the substrate. These may be referred to as "doses" herein.

Using dose mapping according to embodiments of the systems and methods discussed herein, the fabrication process produces consistent feature sizes using a dose map by adjusting at least the lithography operation of the fabrication line to account for process variation that may lead to undesirable feature size variation. A dose map comprises a plurality of information regarding what intensity and duration of doses are to be applied to the substrate during fabrication to avoid inconsistencies and variation in feature size across a substrate or plurality of substrates (e.g., in a batch process). These doses are applied when pulses are transmitted to light-emitting devices such as solid state emitter arrays. Dose maps enable the selective application of varying (tunable) dose types across a single substrate or across a batch of substrates by applying pulses of varying intensity for varying durations in different areas that correspond to the target substrate in order to provide a processing environment that produces consistently-sized (target-sized) features. In some embodiments, digital micromirror devices (DMD) may be used in dose-mapping. In one example, an intensity of a plurality of lasers that are aimed at the DMD may be varied in order to vary the intensity of a frame.

In one example, a dose map becomes a part of its related fabrication program, replacing an originally stored lithography portion of the fabrication program. In other examples, the dose map is loaded by a fabrication server associated with a fabrication line, or with a plurality of fabrication lines, along with the fabrication program and the dose map acts to modify at least part of the fabrication program, for example, the portion of the fabrication program associated with lithography. A dose map and a fabrication program may be linked based upon inputs (e.g., what is read by the fabrication line to initiate production), such as a component identifier, a final product/assembly identifier, a fabrication line, or by other means. The links between inputs, dose maps, and fabrication programs and fabrication lines may be stored in a fabrication system server co-located with the fabrication line or located remotely from a single fabrication line or from a plurality of fabrication lines. The images upon which the dose maps are predicated may be taken on a periodic or continuous basis by an imaging system, depending upon the embodiment. The dose maps discussed herein may be dynamically updated using these continuously or periodically captured images. The dynamic updates may be performed in order to account for factors such as process creep, new product introductions, and operator training. The "identifiers" discussed herein may be numerical, alphabetical, alphanumeric, QR codes, or other unique identifiers that may be used to distinguish among and between component and assembly products and equipment.

In an embodiment, dose maps or feature size maps may be generated based upon a plurality of images captured during fabrication at different stages of fabrication. In some examples, dose maps are generated based on feature size maps. This image capture may occur prior to, during, and/or subsequent to various process phases. The images may be analyzed and compared for a single product on a single fabrication line to develop a dose map for that product and fabrication line. In other embodiments, dose maps or feature size maps may be developed across multiple products for a single line, across multiple lines for a single product or family of products (components or assemblies), or combinations thereof. The images captured may be broken down into a first and a second component with respect to causation. The first component may be referred to as a systematic component, this component may contribute to feature size inconsistency because of equipment-related factors, and the second component is a randomized factor that may depend on environmental and/or operator conditions (human and environmental factors) and may or may not be employed in dose map or feature size map development.

The system factors may include the components and raw materials used in the manufacturing process, such as a resist coating machine that coats a particular region or regions of a substrate with a thinner or thicker layer than the target thickness. Other examples of system components may be temperature variations in the developer and/or a fingerprint in the etching chamber. Using the systems and methods discussed herein, this system variation may be sufficiently compromised for by process adjustments, including increasing a dose of current applied to the structure in one area while decreasing the dose in the other to compensate for the systematic component variation and produce a display with features that are the target size of X-microns.

In an example of a dose map, as the fabrication process drives a substrate from left to right during lithography, a dose applied to different portions may increase or decrease in intensity or duration based upon the information from the dose map that indicate where more or less voltage is to be applied. This enables brightness control across the substrate (chip) during fabrication. In one example, a first column may have 5 V applied, a second may have 4.9 V applied, and a third adjacent column may have 4.8 V applied so that the voltage applied is based upon the condition and quality of the device and more specifically upon the condition and quality across a device to consistently produce target feature sizes, in contrast to applying a consistent (e.g., 5V) voltage across all columns which may not produce consistent target feature sizes. That is, the fabrication system generates a map of the structure prior to the application of current, and adjusts the current applied to each row, column, individual solid state emitter, or combinations thereof which may be referred to as "regions" of the substrate, based upon the map. By selectively and intentionally varying a dose applied to a substrate during the lithography process according to a dose map that can be based on the feature size map, the process variations that may lead to undesirable feature size variation are accounted for and corrected. Thus, dose mapping and feature size mapping, alone or in combination, increase the reliability of the production of consistently-sized features.

The selective application of different dose types to regions across a substrate based on a dose map or a feature size map may vary across variety of fabrication lines and specifically for various pieces of equipment within the fabrication line. Different dose types may comprise different intensities, durations, or both. In one example, an inspection or imaging system comprise a plurality of optics that are configured to take an image of a substrate at various stages in a process in order to determine the state of the feature sizes subsequent to each processing step. The feature size maps generated by the inspection systems, which may be part of the fabrication lines or which may be communicatively coupled to the fabrication lines, are analyzed to determine where features are undersized and where features are oversized across a substrate or substrates (e.g., from the same line or from the same component). This analysis includes generating feature size maps and determining feature size variation across a substrate, e.g., what regions of a plurality of patterned substrates have various sizes of features that are over or under a target feature size or range of sizes. Based on this analysis, a dose map may be generated from one or more feature size maps that indicates what intensity and duration of doses are to be applied during the microlithography, based upon the processing of the substrate both before and after the microlithography is performed. The "communicative coupling" discussed herein defines a relationship between two or more pieces of equipment such that, when communicatively coupled, one or two-way communication is enabled between the pieces of equipment. This communication may include the retrieval of data and/or the transmission of instructions.

Depending upon the embodiment, the dose maps or feature size maps may be generated in various manners. For example, dose maps and feature size maps may be generated and stored by fabrication line, by product, by substrate size, or by other aspects of the manufacturing process and/or end use. In some examples, dose maps and/or feature size maps from a first piece of equipment in a fabrication line may be employed to determine if that piece of equipment may be better suited for a different fabrication line. For example, if a photoresist coating machine is determined, via image capture and analysis during feature mapping, to produce smaller features in a first area, and a developer is determined to produce larger features in the same first area, these pieces of equipment may be combined even if they are from different lines in order to, along with the dose mapping, increase the likelihood of production of consistently-sized features.

FIG. 1A is a perspective view of a photolithography system 100A according to embodiments disclosed herein. The system 100A includes a base frame 110, a slab 120, a stage 130, and a processing apparatus 160. The base frame 110 rests on the floor of a fabrication facility and supports the slab 120. A plurality of passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz, is used as part of a flat panel display. In other embodiments, the substrate 140 is made of other materials capable of being used as a part of the flat panel display. In some embodiments, the substrate 140 has a photoresist layer formed thereon which is sensitive to radiation. A positive photoresist includes portions of the photoresist, which, when exposed to radiation, are respectively soluble to a photoresist developer applied to the photoresist after the pattern is written into the photoresist. A negative photoresist includes portions of the photoresist, which, when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100A includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction as indicated by the coordinate system shown in FIG. 1A. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130, the encoder 126 is configured to provide location information to a controller 190.

In an embodiment, the processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

The controller 190 facilitates the control and automation of the processing techniques described herein. The controller 190 is coupled to or in communication with one or more of the processing apparatus 160, the one or more stages 130, and the encoder 126. The processing apparatus 160 and the one or more stages 130 provide information to the controller regarding the substrate processing and alignment. For example, the processing apparatus 160 provides information to the controller 190 to alert the controller 190 that substrate processing is complete.

The controller 190 includes a central processing unit (CPU) 192, memory 194, and support circuits (or I/O) 196. The CPU 192 is one of any form of computer processors used in industrial settings for controlling various processes and hardware (e.g., pattern generators, motors, and other hardware) and/or monitoring the processes (e.g., processing time and substrate position). The memory 194 is connected to the CPU 192. The memory 194 is one or more of a readily available memory, such as random access memory (RAM), read only memory (ROM), floppy disk, hard disk, or any other form of digital storage, local or remote. Software instructions and data are coded and stored within the memory 194 for instructing the CPU 192. The support circuits 196 are also connected to the CPU for supporting the processor in a conventional manner. The support circuits include conventional cache, power supplies, clock circuits, input/output circuitry, subsystems, and the like. A program (or computer instructions), which may be referred to as an imaging program, is readable by the controller determines which tasks are performable on a substrate. The program is software readable by the controller and includes code to monitor and control, for example, the processing time and substrate position.

During operation, the stage 130 moves in the X-direction from a loading (first) position, as shown in FIG. 1, to a processing (second) position. The processing position is one or more positions of the stage 130 as the stage 130 passes under the processing unit 164. During operation, the stage 130 is be lifted by a plurality of air bearings (not shown) and the stage 130 moves while lifted along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system (not shown) measures the X and Y lateral position coordinates of each of the stage 130 in real-time so that each of the plurality of image projection apparatuses can accurately locate the patterns being written in a photoresist-covered substrate 140. The metrology system also provides a real-time measurement of an angular position of the stage 130 about the vertical or Z-axis. The angular position measurement may be used to hold the angular position of the stage 130 constant during scanning by means of a servo mechanism (not shown), or the angular position measurement may be used to apply corrections to the positions of the patterns being written on the substrate 140 by the image projection apparatus 200A and 200B, shown in FIGS. 2A-2B and discussed below. In some examples, these techniques may be used in combination.

Figure 1B:
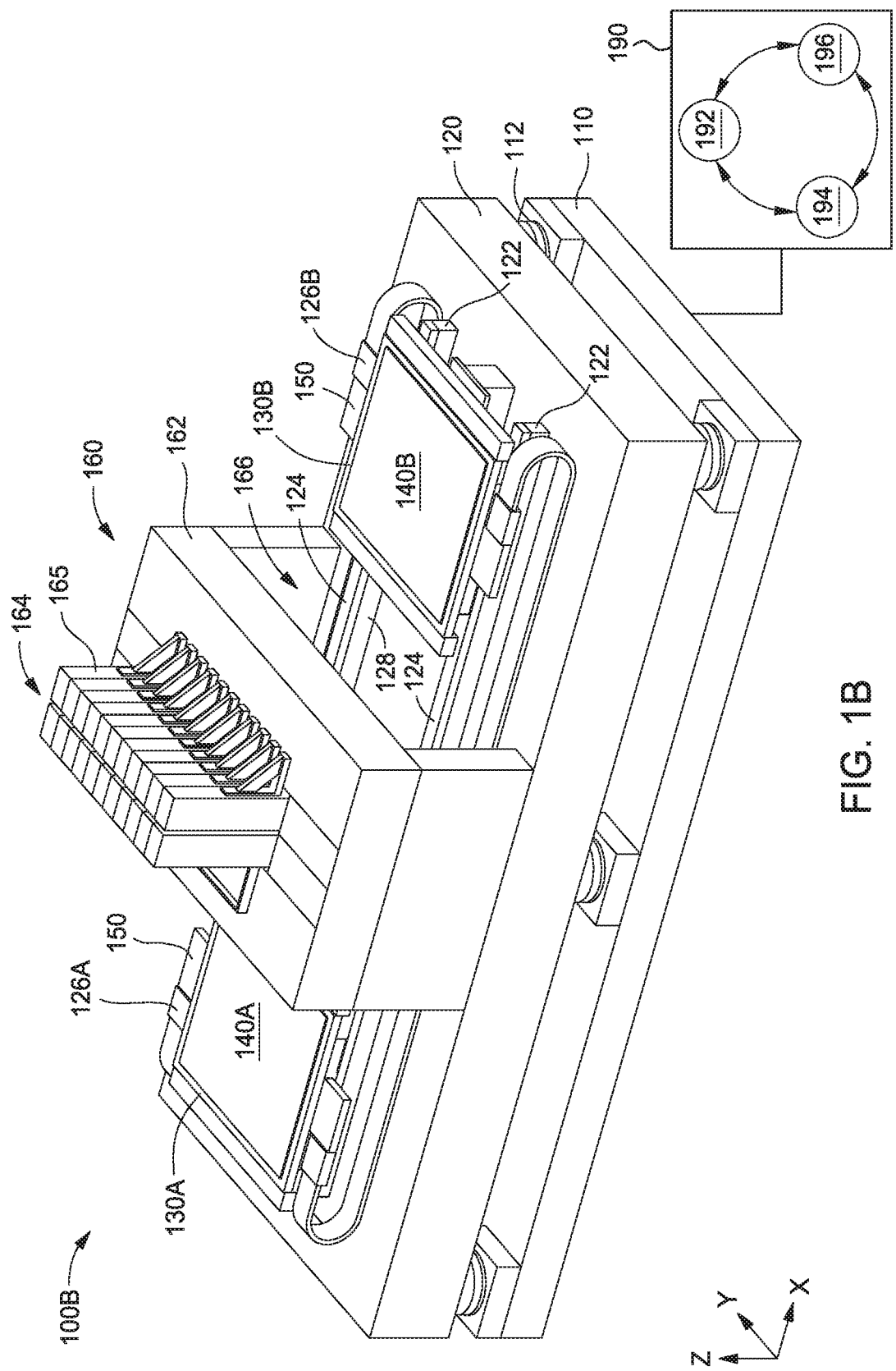
FIG. 1B is a perspective view of an alternate photolithography system according to embodiments disclosed herein.

FIG. 1B is a perspective view of a photolithography system 100B according to embodiments disclosed herein. The system 100B is similar to the system 100A; however, the system 100B includes two stages 130A and 130B. Each of the two stages 130A and 130B is capable of independent operation such that the system can scan a substrate 140A or 140B in a first direction and step in a second, other direction. In some embodiments, when one of the two stages 130A or 130B is scanning a substrate 140, the other of the two stages 130A or 130B is unloading an exposed substrate and loading the next substrate to be exposed. In one example, the first stage 130A scans the substrate 140A, and the second stage 130B unloads an exposed substrate 140B and loads the next substrate (not shown) to be exposed. Also shown in FIG. 1B are the first and second encoders 126A and 126B, respectively co-located with stages 130A and 130B.

While FIGS. 1A-1B each depict an embodiment of a photolithography system (100A and 100B, respectively), other systems and configurations are also contemplated herein. For example, photolithography systems including any suitable number of stages (e.g., 3 or more stages 130) are also contemplated.

Figure 2A:
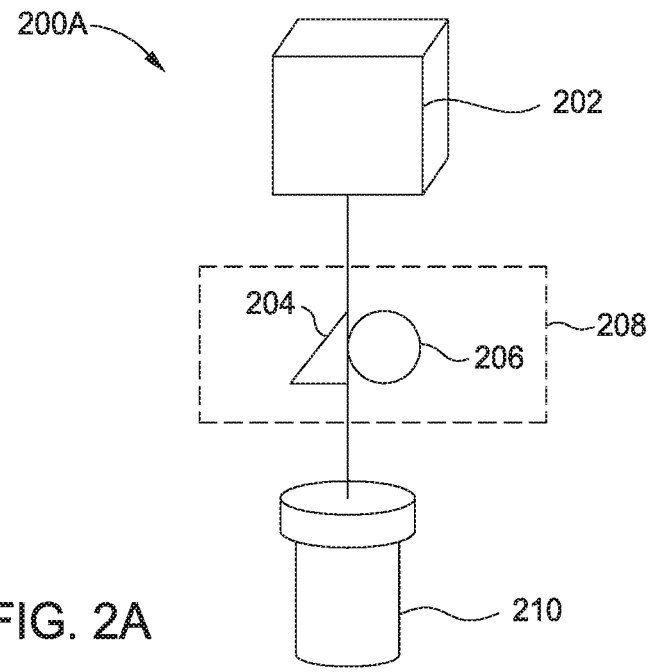
FIG. 2A is a perspective schematic view of an image projection apparatus according to embodiments disclosed herein.

FIG. 2A is a perspective schematic view of an image projection apparatus 200A according to one embodiment. The image projection apparatus 200A may be useful for a photolithography system, such as system 100A or 100B in FIGS. 1A and 1B. The image projection apparatus 200A includes one or more spatial light modulators 202, an alignment and inspection system 208 including a focus sensor 204 and a camera 206, and a plurality of projection optics 210. The components of the image projection apparatus 200A may vary depending on a type of spatial light modulator 202 being used. Spatial light modulators 202 include, but are not limited to, solid state emitters, digital micromirror devices (DMDs), vertical-cavity surface-emitting lasers (VCSELs), liquid crystal displays (LCDs), and other solid state emitters of electromagnetic radiation. The solid state emitters discussed herein emit electromagnetic radiation and may be used in light-emitting devices (LEDs), uLEDs, vertical-cavity surface-emitting lasers (VCSEL), and other devices. Various voltages may be used, depending upon the type of solid state emitter used. In examples where a uLED is employed, a voltage applied may be from 100 mV to 7 V.

In operation, the spatial light modulator 202 is used to emit light and/or modulate one or more properties of the light, such as an amplitude, a phase, or a polarization of the light, which is projected through the image projection apparatus 200A and to a substrate, such as the substrate 140 in FIG. 1A. The alignment and inspection system 208 is used for alignment and inspection of the components of the image projection apparatus 200A or 200B. In one embodiment, the focus sensor 204 includes a plurality of lasers which are directed through the lens of the camera 206 and then back through the lens of the camera 206 and imaged onto sensors to detect whether the image projection apparatus 200A is in focus. The camera 206 is used to image the substrate, such as substrate 140, including to ensure the alignment of the image projection apparatus 200A and photolithography system 100A or 100B is correct or within an predetermined tolerance. The projection optics 210, such as one or more lenses, are used to project the (modulated or unmodulated) light onto the substrate, such as the substrate 140.

Figure 2B:
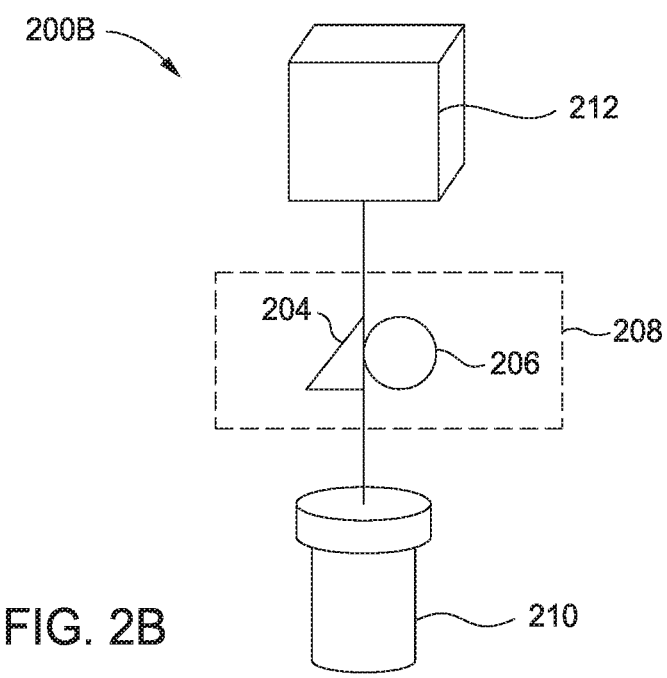
FIG. 2B is an image project apparatus according to embodiments described herein.

FIG. 2B is an image project apparatus 200B according to embodiments described herein. In the embodiment shown in FIG. 2B, the image projection apparatus 200B includes a solid state emitter device 212 as the spatial light modulator(s), a focus sensor and camera system 208 and projection optics 210. In one embodiment, the image projection apparatus 200B further includes a beamsplitter (not shown).

Figure 3:
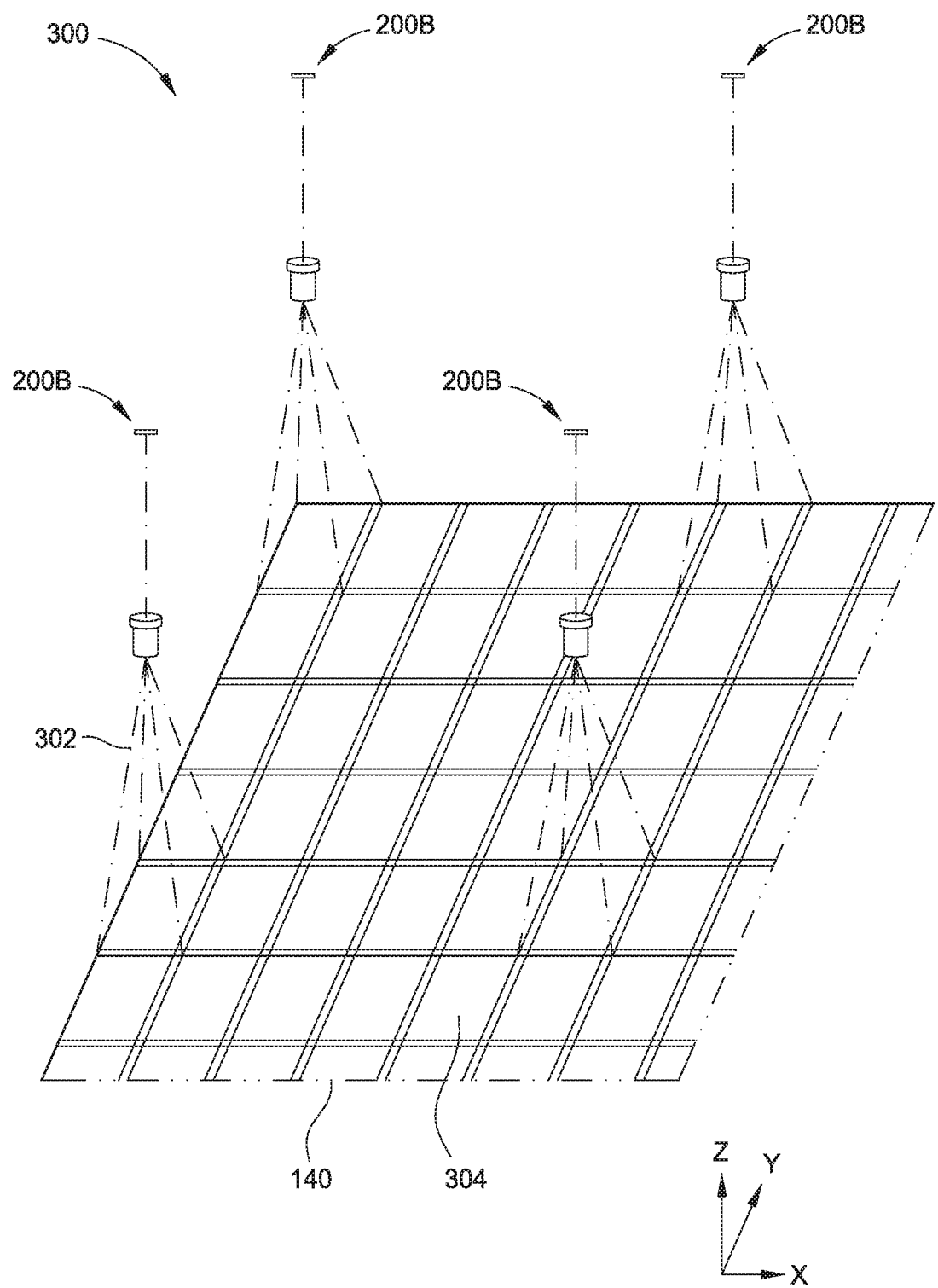
FIG. 3 illustrates a schematic view of a plurality of image projection apparatuses according to embodiments of the present disclosure.

FIG. 3 illustrates a schematic view 300 of a plurality of image projection apparatuses 200B. The plurality of image projection apparatuses 200B may be used in a photolithography system, such as systems 100A and 100B. In operation, each image projection apparatus 200B produces a plurality of write beams 302 onto a surface 304 of the substrate 140. As the substrate 140 moves in the X-direction and/or the Y-direction, as indicated by the coordinate system in FIG. 3, the entire surface 304 (across a substrate 140 from edge to edge) is patterned by the write beams 302. In various embodiments, the number of image projection apparatuses 200B included in the system varies based on factors such as the size of the substrate 140 and/or the speed of the one or more stages 130 (as shown in FIGS. 1A and 1B).

Figure 4:
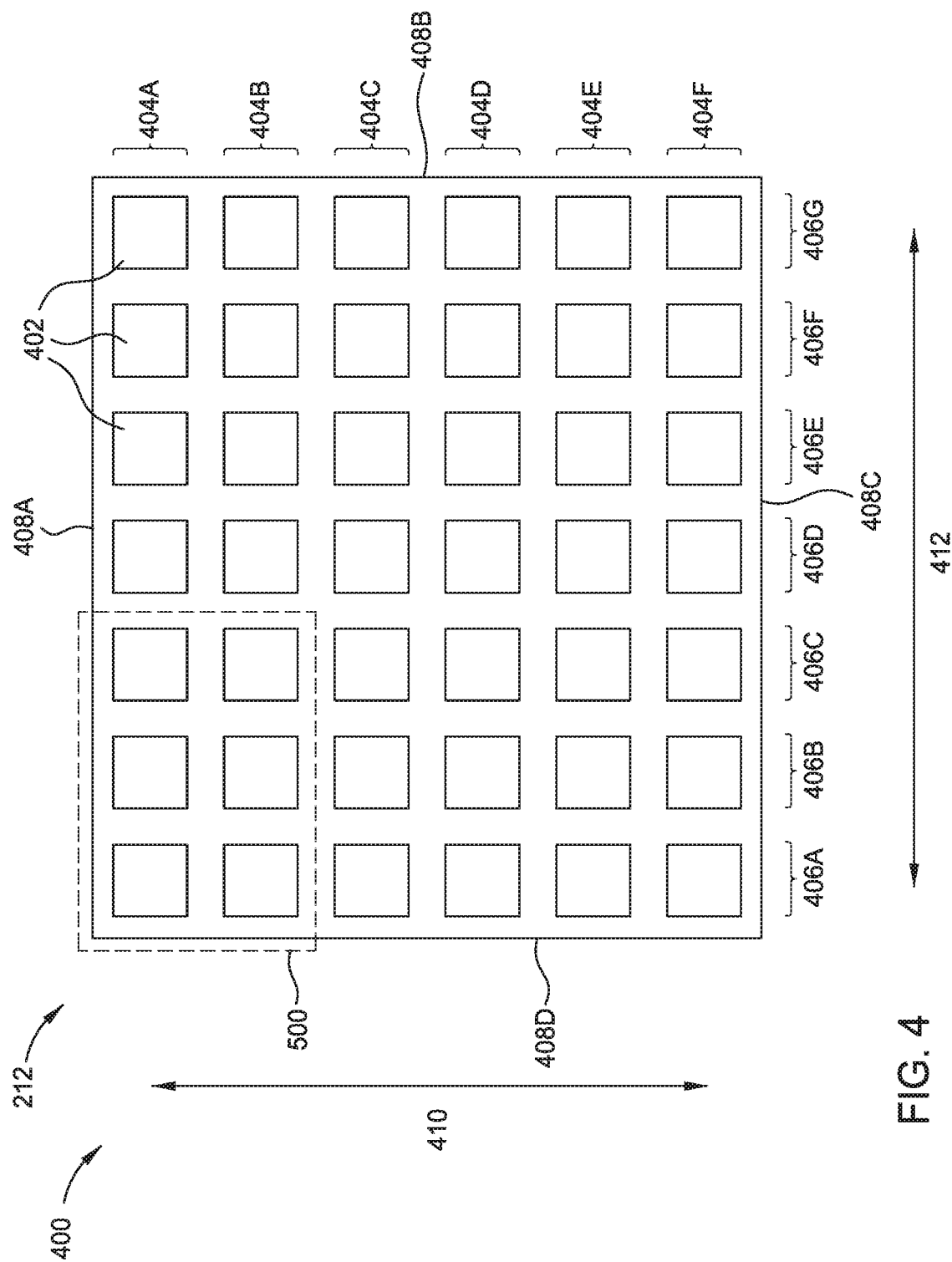
FIG. 4 is a partial schematic illustration of a solid state emitter device according to embodiments of the present disclosure.

Turning to FIG. 4, an example 400 of a solid state emitter device 212 is shown. As shown in FIG. 4, the solid state emitter device 212 includes a plurality of solid state emitters 402 in an array. Since solid state emitters are self-emitting, an outside light source is not included in the image projection apparatus 200B that illustrates the solid state emitter device 212. Additionally, unlike DMD micromirrors which are configurable between an "on" and "off" state, each solid state emitter has a variable intensity which enables an enhanced grayscale controllability. The device 212 may comprise 4 sides, which may be referred to as "edges" herein. The "edge" is a physical boundary of the substrate, and each device 212 may comprise four edges, a first edge 408A, a second edge 408B, a third edge 408C, and a fourth edge 408D. In some examples, the first edge 408A may be referred to as a "north" edge, the second edge 408B may be referred to as a "west" edge 408B, the third edge 408C may be referred to as a "south" edge 408C, and the fourth edge 408D may be referred to as an "east" edge 408D. Thus, references to the "north-south" adjustability or directionality references a direction 410 from 408A to 408C (and 408C to 408A), and references to "east-west" adjustability of directionality references a direction 412 from 408B to 408D (and 408D to 408B). The east-west adjustability discussed herein refers to the tunability of a voltage that is applied to the device 212 as well as the tunability of a gate bias (which may be set to 0 or to greater than 0). In one example, as substrate moves from the edge 408D to the edge 408B, and both the substrate and device 212 are substantially the same shape if not the same size, a plurality of "stripes" are formed when the voltage is received by some of the emitters from the device 212. By providing different amounts of voltage to rows along the edges 408A, 408B, 408C, and 408D through a common rail, the intensity and brightness of the edge-located columns may be less than those towards the center of the device 212. Each solid state emitter 402 has a gate (ground) that can be set to 0, so the difference between the voltage applied in a pulse and the ground dictates the brightness of the emitter. Thus, either or both of the voltage applied to the device 212 or the bias on the gates (grounding) can be applied to attenuate the brightness.

The solid state emitters 402 are arranged in an array comprising a plurality of rows 404A-404F and a plurality of columns 406A-406G. While six rows and seven columns are shown in FIG. 4 as an example, in other embodiments, a solid state emitter device 212 may include millions of solid state emitters 402, each of which corresponds to a pixel in a display. For example, one embodiment of a solid state emitter device has a size of 1024 by 2048 pixels. In one example a pulse applied to the transistors of 404C may have a higher intensity and/or longer duration than a pulse applied to the transistors of row 404B, and the pulse applied to the transistors of row 404B may have a higher intensity and/or longer duration than a pulse applied to row 404A at the north edge 408A of the device 212. Similarly, a pulse applied to the transistors of column 406E may comprise a higher intensity and/or longer duration than the pulse applied to column 406F, which may be of a higher intensity and/or longer duration than that applied to column 406G since the column 406G is along the edge 408B of the device 212. The attenuation or amplification of the pulses applied to the device 212 across various regions of a substrate in either direction 410 and/or 412 thereby forms a plurality of patterned features on the substrate of a desired (target) feature size.

Figure 5:
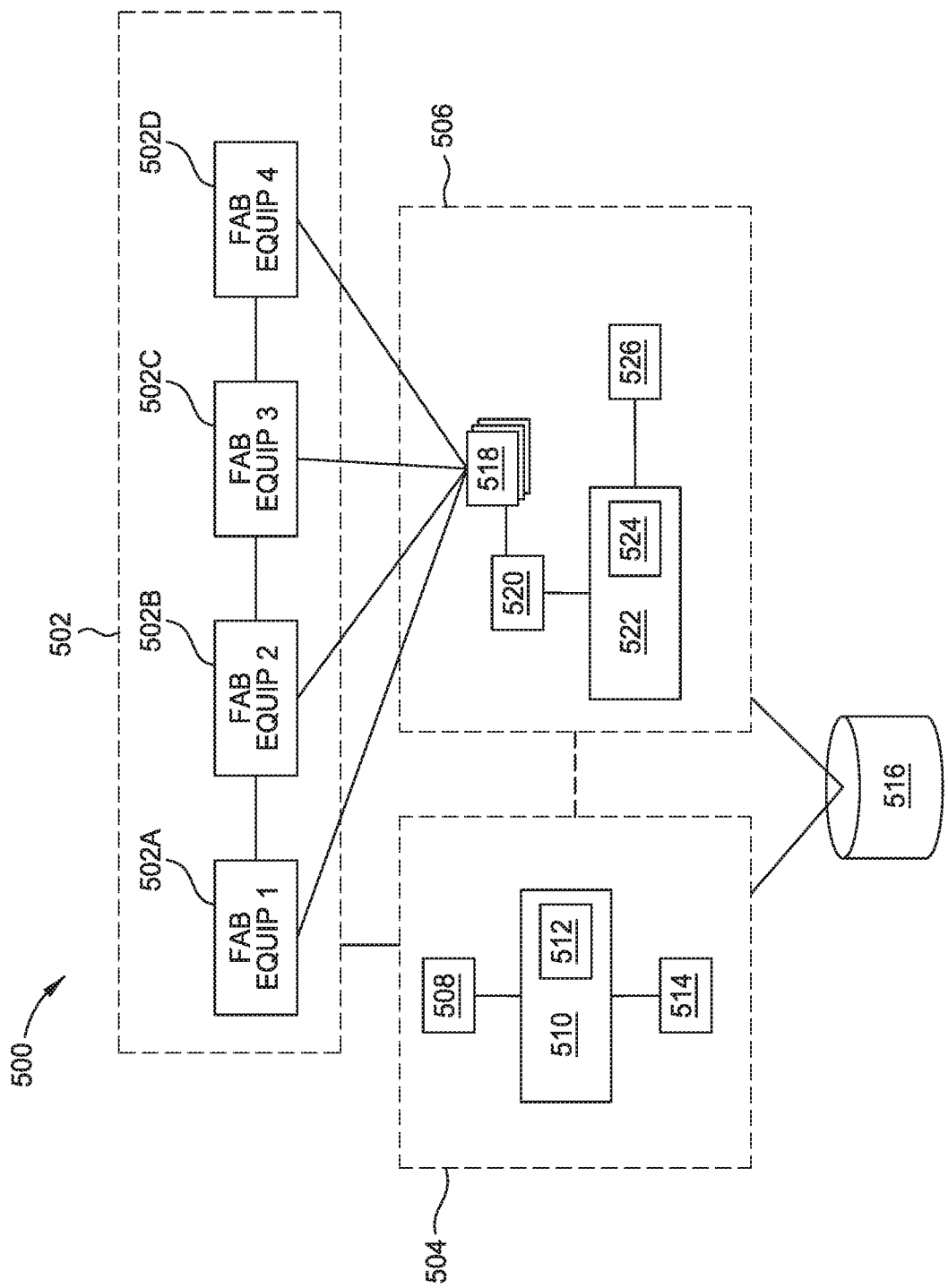
FIG. 5 is a schematic illustration of a system of fabricating display components according to embodiments of the present disclosure.

FIG. 5 is a schematic illustration of a system 500 of fabricating display components according to embodiments of the present disclosure. The system 500 comprises a fabrication line 502 coupled to a fabrication line server 504 comprising a controller 508 configured to transmit instructions to and thus control operation of the fabrication line 502 that includes example fabrication equipment 502A, 502B, 502C, and 502D. The fabrication line server 504 further comprises a storage device 510 where at least one application 512 is stored which may be executed by the processor 514. The fabrication line server 504 may further be communicatively coupled to one or more data stores 516 that store a plurality of fabrication programs for fabricating device components and a plurality of dose maps and feature size maps, discussed in detail below. In an embodiment, a plurality of substrates may be fabricated using the system 500, and there may be a plurality of inputs to the fabrication line 502 (which may comprise one or more graphical user interfaces (GUIs) not shown here). These inputs may be employed by the server 504 to determine which fabrication program or programs is to be loaded from the data store 516 and executed at the fabrication line 502.

The fabrication programs may comprise various settings for one or more pieces of fabrication equipment 502A-502D, each of which may represent one or more physical pieces of equipment associated with processing blocks discussed herein. The inputs may comprise fabrication lines, component or assembly identifiers, and/or other inputs upon which a fabrication program may be identified. The data store 516 comprises a plurality of links between these identifying inputs and fabrication programs. In some embodiments, a single input is associated with a single fabrication program, and in alternate embodiments, one or more inputs may be associated with a single fabrication program, or a single input may be associated with one or more fabrication programs and a plurality of logic may be stored on the system 100A to determine which program to execute, for example, based on a time of year, a volume of product, or other factors. The communication between the fabrication line server 504 and the fabrication line 502 and data stores 516 may be wired, wireless, or a combination of various communication technologies.

In an embodiment, the controller 508 may be further configured to communicate with an imaging system 506. The imaging system 506 comprises a plurality of optics 518, a controller 520 configured to transmit data to and from the fabrication line 502 as well as the fabrication line server 504. The imaging system 506 further comprises a non-transitory storage device 522 comprising at least one image processing application 524 that may be executed by the processor 526. The imaging system 506 is also in communication with the data store(s) 516. While the imaging system 506 is shown in FIG. 5 as in communication with a fabrication line 502 via the server 504, in other embodiments, the imaging system 506 may be communicatively coupled to a plurality of fabrication lines across both local and remote fabrication facilities. In an embodiment, the imaging system 506 is integral to the fabrication system 500 and co-located with the fabrication line 502 and/or server 504 if the server 504 is remote. In an alternate embodiment, the imaging system 506 is a stand-alone system that may be in communicatively coupled to or more co-located or remote fabrication lines and servers, thus aggregating image data across many fabrication lines and product types.

In an embodiment, the plurality of optics 518 are removably coupled to one or more pieces 502A-502D of the fabrication line 502. The plurality of optics 518 may be configured to capture images before and/or after each substrate or batch of substrates is processed. These images are captured by the imaging system 506 via the optics 518, and may be processed (analyzed) by the imaging application 524 and/or by the fabrication application 512 on the server 504. This analysis may include comparing images captured during fabrication with an image or images of a fabricated device in order to determine undesired feature size variation across a substrate or batch of substrates. While the system 500 may process batches (more than one) of substrates, a single substrate is discussed here as an example. Based upon this analysis, the application(s) 514 and/or 524 may determine how to adjust one or more blocks 502A-502D in order to fabricate feature sizes with improved consistency across a substrate.

In one example, block 502A comprises photoresist coating of a substrate, block 502B comprises photolithography or lithography, block 502C comprises a developer block, and block 502D comprises an etching block. Based upon the analysis of captured images, which may be referred to as feature size mapping, a dose map may be generated and used for block 502B. This dose map comprises instructions on an adjustment of at least one of an intensity of an exposure (voltage/current dose) or a duration of exposure of various regions of a substrate. For example, if a dose of 5V for 10 microseconds was to be applied across the substrate according to the fabrication program associated with an input to the fabrication line, the dose map may modify this to have a dose of 5V for 10 microseconds (ms) in a first region, a dose of 4.5V for 7 ms in a second region, and a dose of 7V for 12 ms in a third region. Each of the first, second, and third regions may comprise one or more individual pixel, and some or all of one region may overlap with another region. By adjusting the dose applied to different areas across the substrate, the features produced exhibit a more consistent feature size since the dose(s) applied are based upon known fabrication data for the product and/or the fabrication line. Thus, the use of the dose map during device fabrication results in improved feature size consistency across the substrate since the dose map accounts for process variation that may lead to variation in feature size in different regions of the substrate.

Figure 6:
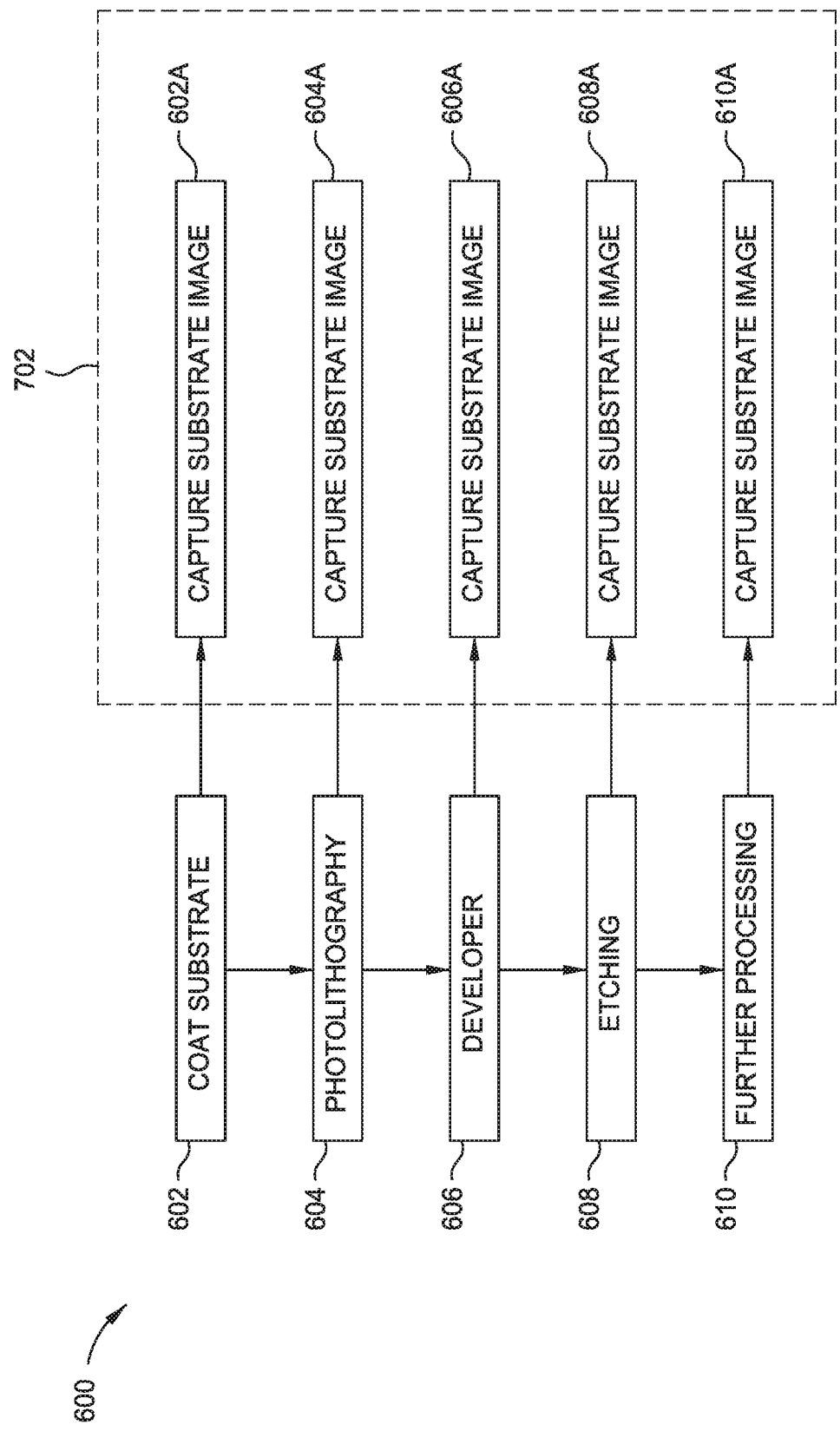
FIG. 6 is a flow chart of an example method of device fabrication according to embodiments of the present disclosure.

FIG. 6 is a flow chart of an example method 600 of device fabrication according to embodiments of the present disclosure. In the method 600, a plurality of blocks 602, 604, 606, 608, and 610 may represent various processes executed on a substrate for electronics device manufacture. While at least some of these blocks 602, 604, 606, and 608 are associated with a subsequent and/or simultaneous image capturing block 502, further discussed in FIG. 5. In one embodiment of the method 600, a substrate or a plurality of substrates are coated with a photoresist material at block 602 in one or more coating cycles. At block 602A, an imaging system such as the imaging system 506 in FIG. 5 captures an image of the substrate. In some examples, at block 602A, a plurality of images may be taken before, during, and after the coating at block 602. Similarly, at block 604 which may comprise photolithography or lithography, a plurality of images may be captured before, during, and/or after the that block 604 at block 604A. Images may also be captured at block 606A as a part of the developer block 606, at block 608A as a part of the etching at block 608, and, in some embodiments, further images may be captured at block 610A during further processing operations at block 610. Similarly to blocks 602A and 604A, the images captured at blocks 606A, 608A, and 610A may be captured prior to, during, and/or subsequent to processing These images captured at blocks 602A-610A may be analyzed by the imaging system and/or transmitted to a server (such as the server 504 in FIG. 5) associated with the fabrication line for analysis, further analysis, and/or to be linked to an input, a fabrication line, and/or a fabrication program and stored as linked in a data store. In some examples, image capturing occurs at all of the fabrication blocks 602A-608A, and in some embodiments it may occur at less than all of the fabrication blocks 602-608. Further in some embodiments, there may be images captured at block 610A during processing that occurs subsequent to the etching at block 608, regardless of whether or not images are captured at blocks 602A-608A.

Figure 7:
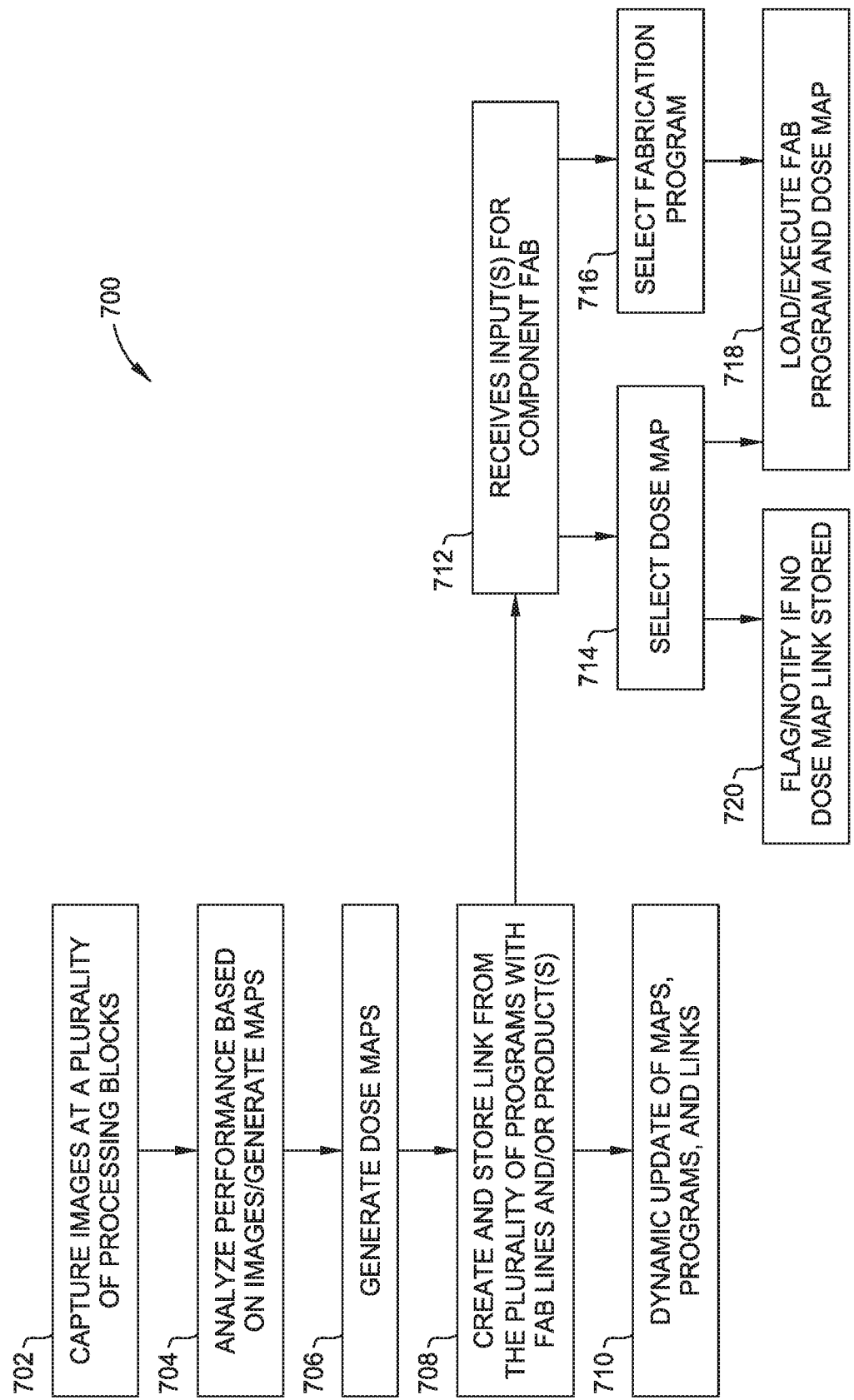
FIG. 7 is a method of fabrication of substrates according to embodiments of the present disclosure.

FIG. 7 is a method 700 of fabrication of substrates, including the patterning of substrates. In the method 700, at block 702, an imaging system such as 506 in FIG. 5 captures a plurality of images from at least one fabrication line. The images captured at block 702 are analyzed at block 704 during feature size mapping either at the imaging system or by an application on a server associated with the fabrication line or with a plurality of fabrication lines or fabrication locations. The feature size mapping analysis at block 704 may comprise at least (1) comparing feature size development at various states of fabrication to form feature size maps; (2) correlating the feature size variation to a fabrication line, product identifier, or other identifying means; (3) determining which portions of a substrate comprise undersized features, which comprise oversized features, and which comprise target-sized features.

At block 706, based on the analysis at block 704, a plurality of dose maps are generated and stored with links to a fabrication line, a product identifier, or other identifying means that may be used at block 712 discussed below. Each dose map of the plurality of dose maps comprises information regarding an intensity and duration of doses to be applied in one or more passes over a substrate. The doses (intensity and/or duration) may be varied based on this map when a fabrication program is executed, such that a portion of the substrate that the feature size mapping analysis at block 704 indicate has oversized features (as compared to a target feature size) is given a lower dose (intensity and/or duration) than surrounding portions where target-sized features were produced. Similarly, a different portion of the substrate that the feature size mapping analysis at block 704 indicate has undersized features is given a higher dose (intensity and/or duration) than surrounding portions where target-sized features were produced. The portions discussed herein may be rows, columns, regions of rows and columns, or single pixels, and some portions may overlap in whole or in part.

At block 708, the feature size maps and/or dose maps are linked to input information for later use and stored with these links in a data store or other location accessible by the fabrication line. Block 710 represents the dynamic nature of the image capture and resultant dose maps, the images are captured at block 702 on a continuous, periodic, or triggered basis (e.g., based upon fabrication line scrap, downtime, new product development, product obsoleting, etc.). The dynamic nature of the process and system enables detection and adjustment for process creep, training issues (human factors), and other manufacturing challenges that, if unchecked, may lead to downtime and/or scrap, or other unnecessary cost or environmental risk.

Subsequent to the creation and storage of links between feature maps, dose maps, programs, and inputs, the system may receive an input or inputs at block 712 to initiate component fabrication on one or more fabrication lines. At block 714, based on the input(s) at block 712, an application such as 512 from FIG. 5 determines from the stored information (e.g., the information in data store 516) whether the input is associated with a stored link to a feature map or dose map and, if so, which feature map or dose map. Each feature map or dose map may be associated with a unique identifier that may be referenced in the link to the input or inputs. For example, a first dose map may be associated with one or more product (end use) or component (not a final product) identifier, and a second dose map may be associated with a particular fabrication line but not associated with any product or component identifier information. In this example, if the particular fabrication line is associated with a dose map, and a different dose map is associated with a product identifier, a plurality of logic stored in the system is configured to determine which dose map to select.

At bock 716, which may occur prior to, after, or simultaneously with block 714, the application determines a fabrication program associated with one or more inputs. In one example, a fabrication program may be associated with a single product or component identifier, and in another example, a fabrication program may be associated with one or more product or components identifiers (or both types of identifier). In an embodiment, a fabrication program may be associated with both a product identifier and a component identifier and a fabrication line, thus the determination at block 716 may be based upon a combination of inputs received at block 712.

At block 718, the feature size map or dose map selected at block 714 and the fabrication program selected at block 716 are executed. In an embodiment where a dose map is selected at block 714, this execution at block 718 comprises the controller of the system causing the dose map instructions to execute as a part of the fabrication program. In some embodiments, if no dose map is found and thus none is selected at block 714 based upon the inputs received at block 712, the inputted information may be flagged in the system for further review at block 720. In some examples, also at block 720, at least one notification may be transmitted to a system administrator to alert them to the lack of a dose map or a feature map (or both) for the instant inputs. Dose maps and feature maps may not be stored, for example, for new components or assemblies, for components that have never been run on a particular fabrication line, and/or for components that may be associated with new, different, or additional assembly identifiers.

During the loading and execution of fabrication based on the selected dose map at block 718, instead of applying the same dose to a plurality of regions of the target substrate, the dose(s) applied to regions as indicated on the dose map may be modulated in at least one of intensity, time, and number of dose(s) applied. FIGS. 8B-8D illustrate examples of dose maps and are discussed below. Based on the dose map, the system is able to apply a plurality of doses of varying intensities and/or durations to distinct and/or overlapping regions of a target substrate to produce consistently-sized features that are a target size or within a predetermined tolerance of the target size, thus improving component and assembly quality and reducing scrap. The systems and methods herein also enable monitoring and correction/preventive actions related to process creep.

FIG. 8A illustrates a dose map 800A that causes a single dose type 802 (intensity and duration) is applied from edge to edge. FIGS. 8B and 8C are exemplary dose maps for the components with a single identifier that are run on a first (FIG. 8B) and a second (FIG. 8C) line, respectively. For example, the dose map 800B in FIG. 8B has a region 802 indicating a first dose type is applied, as well as regions 804 where a "lighter" dose type is applied, for example, a dose with a lower intensity and/or for a shorter duration than the dose applied to the region 802. Also shown in FIG. 8B are regions 806 where a "heavier" dose type is applied, for example, a dose with a higher intensity and/or longer duration than the dose applied in the region 802. FIG. 8C illustrates an example dose map 800C for the same component as in FIG. 8B but using a different fabrication line.

FIGS. 8D and 8E illustrate example dose maps for different components manufactured on the same fabrication line. Similarly to the dose maps discussed above, the dose map 800D in FIG. 8D has a region 802 indicating a first dose type is applied, as well as regions 804 where a "lighter" dose type is applied, for example, a dose with a lower intensity and/or for a shorter duration than the dose applied to the region 802. Also shown in FIG. 8D are regions 806 where a "heavier" dose type is applied, for example, a dose with a higher intensity and/or longer duration than the dose applied by the pulses in the region 802. FIG. 8E illustrates an example dose map 800E for the same component as in FIG. 8D but using a different fabrication line.

In an embodiment, the doses applied in regions 802, 804, and 806 are determined based upon historical information about feature size(s) produced in those regions. For example, the regions where the dose 804 is to be applied may have historically produced oversized features, and the regions where the dose 806 is to be applied may have historically produced undersized features. By adjusting the dose(s) applied across the substrates in various regions, consistent features sizes are achieved during the fabrication process since the dose adjustment(s) are selected to compensate for variations in manufacturing that may lead to feature size variation. The doses applied among and between the regions 802, 804, and 806 may differ, such that the shading and/or patterns shown in FIGS. 8A-8E illustrate differences between doses applied in those regions, and do not indicate the same or similar doses being applied in regions 802, 804, and 806 among and between the embodiments 800B-800E. While the regions 804 and 806 are illustrated as four-sided polygons for illustration purposes in FIGS. 8B-8E, these regions may comprise two or more dose types, and may be configured in various shapes including polygons, ellipses, circles, triangles, or irregular shapes.

Discussed herein are systems and methods employed in dose mapping in order to produce a higher quality display system an enable the scaling-up of display sizes.

While the foregoing is directed to embodiments of the present disclosure, other and further embodiments of the disclosure may be devised without departing from the basic scope thereof, and the scope thereof is determined by the claims that follow.

What is claimed is:

1. A method of display manufacturing comprising:
receiving, by an application stored on a fabrication system, at least one input associated with component fabrication, wherein the input comprises a component identifier or a fabrication line identifier;
selecting, by the application, based on the at least one input, from a data store comprising a plurality of fabrication programs, a fabrication program;
executing the fabrication program, wherein a plurality of pulses are applied to a substrate;
capturing a set of images of the substrate, via an imaging system associated with the fabrication system, during each stage of fabrication;
analyzing the set of images with feature size mapping to generate a dose map by:
determining a feature size variation based on a comparison of feature size development and form feature size maps;
correlating the feature size variation with the input; and
determining the feature size variation of each portion of the substrate;
generating the dose map including a set of adjustments for the plurality of pulses applied that is linked to the input; and
generating, subsequent to executing the fabrication program with the dose map, a plurality of features of a predetermined size on the substrate by applying an adjusted dose to each region of the substrate.

2. The method of claim 1, wherein executing the fabrication program comprises modifying a portion of the fabrication program based on the dose map and executing the modified portion of the fabrication program.

3. The method of claim 1, further comprising: breaking down each captured image into a first component and a second component.

4. The method of claim 3, wherein the first component is a systematic component contributing to the feature size variation based on fabrication equipment and the second component is an environmental factor contributing to the feature size variation.

5. The method of claim 1, wherein the image capturing system captures a set of data from a set of locations.

6. A method of device fabrication, comprising:
   capturing a set of images of a first substrate at each stage of fabrication;
   analyzing the set of images with feature size mapping to generate a dose map by:
      determining a feature size variation based on a comparison of feature size development and form feature size maps;
      correlating the feature size variation with the input; and
      determining the feature size variation of each portion of the first substrate;
   generating the dose map including a set of adjustments for a plurality of pulses applied that is linked to the input;
   selecting, by an application stored in a non-transitory memory of a fabrication server in response to receiving a plurality of fabrication inputs, a fabrication program associated with at least one of the plurality of fabrication inputs, wherein each fabrication program is associated with a plurality of processing parameters for a fabrication line;
   selecting, by the application, based on the plurality of fabrication inputs, the dose map of a plurality of dose maps;
   modifying, by the application, based on the dose map, a subset of processing parameters of the plurality of processing parameters in the selected fabrication program;
   subsequent to the modification of the subset of processing parameters, executing, by the application, the selected fabrication program; and
   forming, in response to the execution of the selected fabrication program by the application, a plurality of features of a target size across a second substrate.

7. The method of claim 6, further comprising selecting the dose map from the plurality of dose maps stored in the non-transitory memory of the fabrication server.

8. The method of claim 6, further comprising selecting the fabrication program from the plurality of fabrication programs stored in the non-transitory memory of the fabrication server.

9. The method of claim 6, further comprising associating each of the plurality of fabrication programs with at least one fabrication line and a component identifier or assembly identifier and storing the associations in a data store.

10. The method of claim 6, further comprising selecting the dose map from the plurality of dose maps stored in a non-transitory memory of a imaging system, wherein the imaging system is communicatively coupled to the fabrication line.

11. The method of claim 6, further comprising selecting the fabrication program from the plurality of fabrication programs stored in a non-transitory memory of a imaging system, wherein the imaging system is communicatively coupled to the fabrication line.

12. The method of claim 6, wherein modifying the subset of processing parameters comprises modifying process parameters associated with lithography based on the dose map to apply a plurality of dose types across the substrate, wherein the dose map identifies a plurality of regions on a substrate, wherein each region is associated with a dose type of the plurality of dose types.

13. The method of claim 12, wherein, prior to modification, the process parameters associated with lithography are associated with a single dose type.

14. The method of claim 6, wherein the dose map further comprises an order in which the dose types are to be applied to each region of a substrate.

15. A non-transitory computer-readable storage medium including contents that are configured to cause a fabrication system to selectively apply pulses to regions of an electromagnetic radiation source to apply doses to pattern a substrate by performing a method comprising:
   capturing a set of images of a first substrate at each stage of fabrication;
   analyzing the set of images with feature size mapping to generate a dose map by:
      determining a feature size variation based on a comparison of feature size development and form feature size maps;
      correlating the feature size variation with an input; and
      determining the feature size variation of each portion of the substrate;
   generating the dose map including a set of adjustments for the plurality of pulses applied that is linked to the input;
   selecting, in response to receiving a plurality of fabrication inputs, a fabrication program associated with at least one of the plurality of fabrication inputs, wherein each fabrication program is associated with a plurality of processing parameters for a fabrication line;
   selecting, based on the plurality of fabrication inputs, the dose map from a plurality of dose maps;
   modifying, based on the selected dose map, a subset of processing parameters of the plurality of processing parameters in the selected fabrication program;
   subsequent to the modification of the subset of processing parameters, executing, by the application, the modified fabrication program; and
   forming, in response to the execution of the modified fabrication program, a plurality of features of a target size across a second substrate.

16. The non-transitory computer-readable storage medium of claim 15, wherein modifying the subset of processing parameters comprises modifying process parameters associated with lithography based on the dose map to apply a plurality of dose types across the substrate, wherein the dose map identifies a plurality of regions on a substrate, wherein each region is associated with a dose type of the plurality of dose types.

17. The non-transitory computer-readable storage medium of claim 15, wherein, prior to modification, the process parameters associated with lithography are associated with a single dose type.

18. The non-transitory computer-readable storage medium of claim 15, wherein executing the modified fabrication program comprises:
   applying a first dose type to a first region of the substrate; and
   applying a second dose type to a second region of the substrate;
   wherein the first dose type differs in either intensity or duration from the second dose type.

19. The non-transitory computer-readable storage medium of claim 18, wherein the first region is separate from the second region.

20. The non-transitory computer-readable storage medium of claim 18, wherein a portion of the first region overlaps with a portion of the second region.

* * * * *